(12) United States Patent
Yanagida

(10) Patent No.: US 8,365,027 B2
(45) Date of Patent: Jan. 29, 2013

(54) PROCESSOR AND METHOD FOR CONTROLLING STORAGE-DEVICE TEST UNIT

(75) Inventor: Masahiro Yanagida, Kawasaki (JP)

(73) Assignee: Fujitsu Limited, Kawasaki-Shi (JP)

( * ) Notice: Subject to any disclaimer, the term of this patent is extended or adjusted under 35 U.S.C. 154(b) by 490 days.

(21) Appl. No.: 12/628,470

(22) Filed: Dec. 1, 2009

(65) Prior Publication Data

US 2010/0138707 A1 Jun. 3, 2010

(30) Foreign Application Priority Data

Dec. 3, 2008 (JP) ................................ 2008-308419

(51) Int. Cl.
*G11C 29/00* (2006.01)
(52) U.S. Cl. ........................ 714/723; 714/719
(58) Field of Classification Search .................. 714/718, 714/719, 723; 365/201
See application file for complete search history.

(56) References Cited

U.S. PATENT DOCUMENTS

| | | | | |
|---|---|---|---|---|
| 6,477,672 B1 * | 11/2002 | Satoh | ............................ | 714/721 |
| 6,536,005 B1 * | 3/2003 | Augarten | ...................... | 714/723 |
| 6,587,975 B2 * | 7/2003 | Mori et al. | .................... | 714/723 |
| 6,711,705 B1 * | 3/2004 | Yasui | ............................ | 714/723 |
| 6,748,562 B1 * | 6/2004 | Krech et al. | ................... | 714/723 |
| 7,661,044 B2 * | 2/2010 | Astigarraga et al. | .......... | 714/723 |
| 8,074,130 B2 * | 12/2011 | Sato | ............................... | 714/723 |
| 2002/0006065 A1 | 1/2002 | Suzuki | | |
| 2007/0150777 A1 | 6/2007 | Sasaki | | |

FOREIGN PATENT DOCUMENTS

| | | |
|---|---|---|
| JP | 2002-32998 | 1/2002 |
| JP | 2004-86996 | 3/2004 |
| JP | 2006-38782 | 2/2006 |
| JP | 2007-172778 | 7/2007 |

OTHER PUBLICATIONS

Hoffstetter, D.M.; Manley, M.H.; , "A systematic test methodology for identifying defect-related failure mechanisms in an EEPROM technology," Microelectronic Test Structures, 1994. ICMTS 1994. Proceedings of the 1994 International Conference on , vol., No., pp. 114-118, Mar. 22-25, 1994.*
Vollrath, J.; Rooney, R.; , "Pseudo fail bit map generation for RAMs during component test and burn-in in a manufacturing environment," Test Conference, 2001. Proceedings. International , vol., No., pp. 768-775, 2001.*

* cited by examiner

*Primary Examiner* — Cynthia Britt
(74) *Attorney, Agent, or Firm* — Staas & Halsey LLP

(57) ABSTRACT

A processor includes an arithmetic device, a storage device that holds arithmetic data, a data generator that generates test data, an address generator that generates an address at which the test data is to be written, a test data number counter that counts a number of test data, an error information holder that holds mismatch error information, an error occurrence bit position holder that holds a position of a bit at which a mismatch error has occurred, an error occurrence test data number holder that holds number of test data counted by the test data number counter, and a comparator that compares test data written to the storage device with test data read from the storage device and stores error information in the error information holder and a position of a bit and number of the test data in which the mismatch error has occurred.

8 Claims, 21 Drawing Sheets

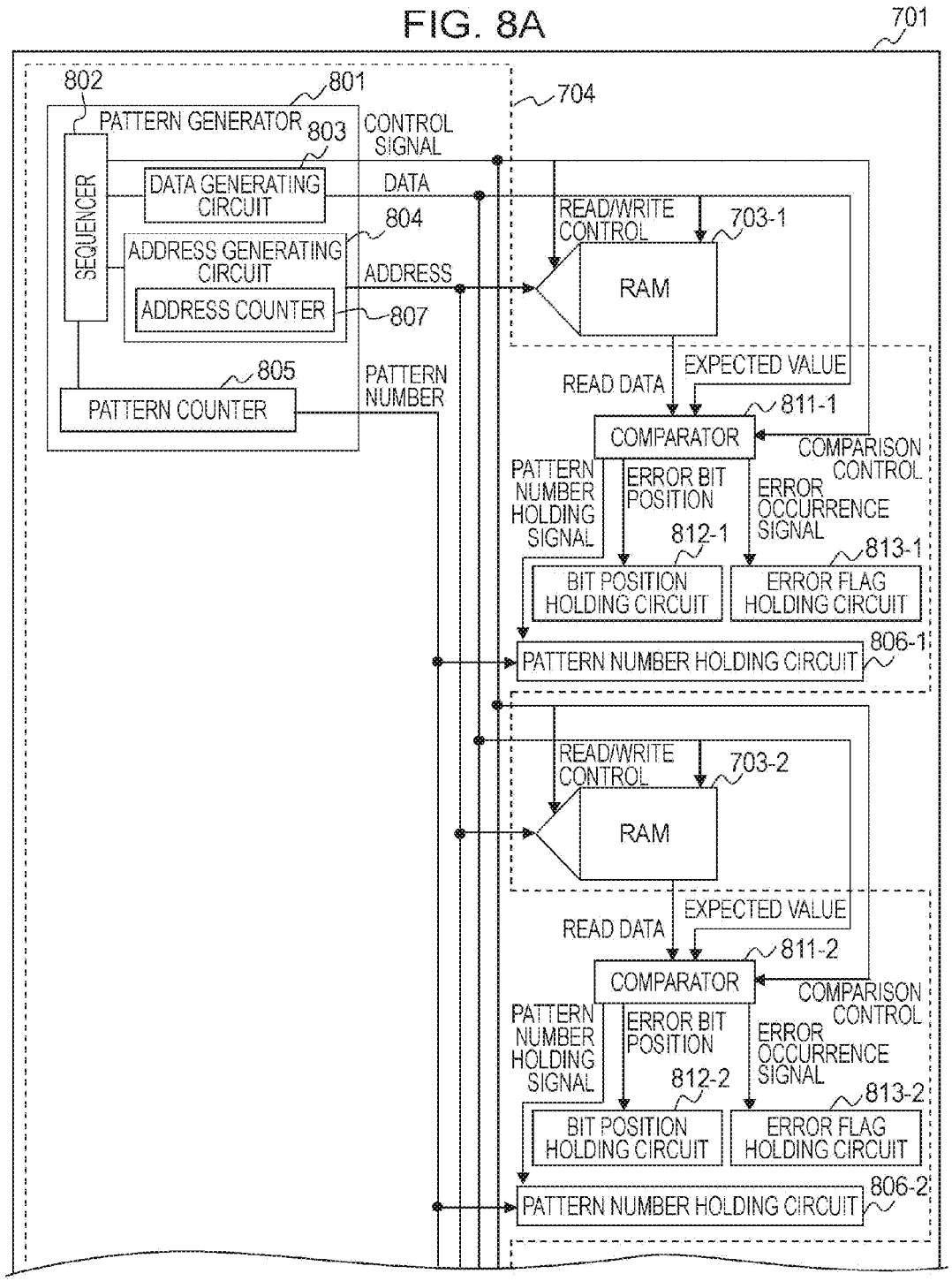

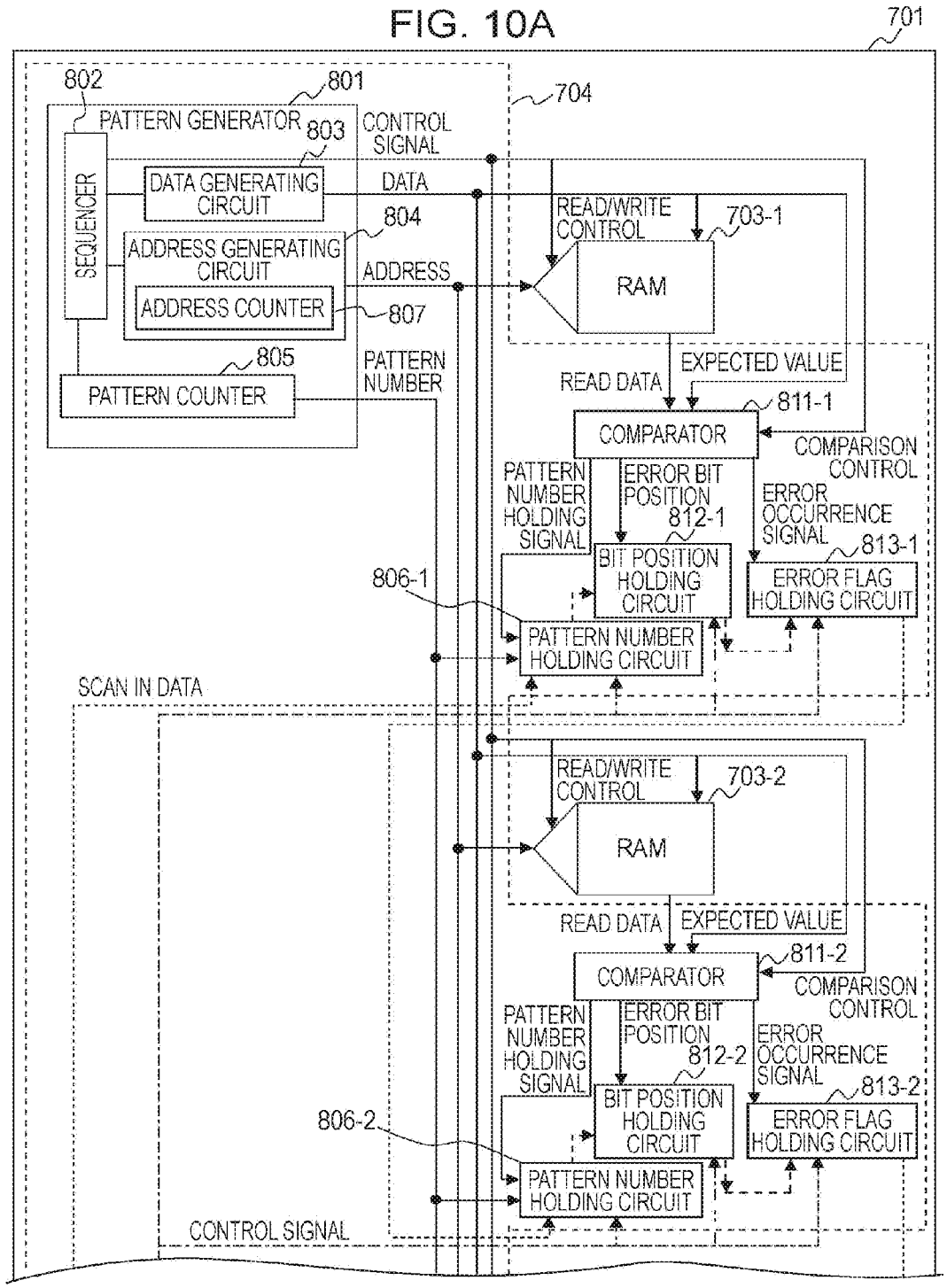

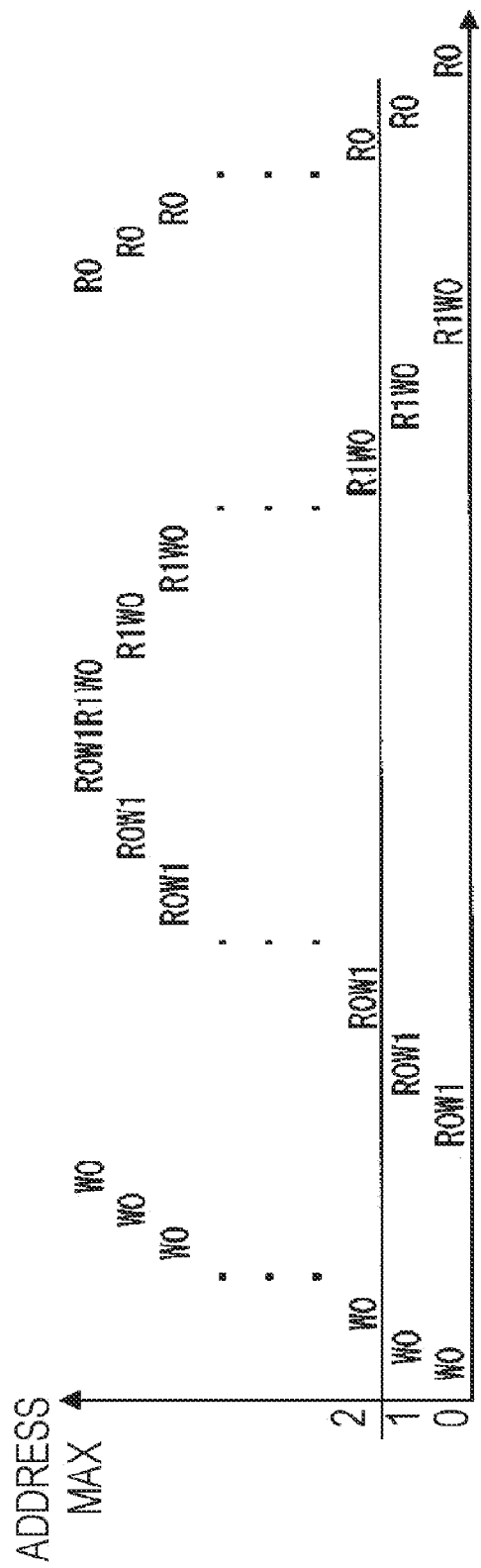

PROCESSOR AND METHOD FOR CONTROLLING STORAGE-DEVICE TEST UNIT

CROSS-REFERENCE TO RELATED APPLICATIONS

This application is based upon and claims the benefit of priority of the prior Japanese Patent Application No. 2008-308419, filed on Dec. 3, 2008, the entire contents of which are incorporated by reference herein.

BACKGROUND

1. Field

The present invention relates to a processor and a method for controlling storage-device test unit.

2. Description of the Related Art

Recently, the degree of integration of large scale integration (LSI) circuits has been increasing, and the capacity and the number of random access memories (RAMs) included in LSI circuits have been increasing. Accordingly, the number of test patterns for RAM and the test time of RAM tests have also been increasing.

In LSI circuits, many built-in self-test (BIST) circuits are currently used in testing RAMs included in the LSI circuits.

A BIST circuit includes a pattern generator for generating a test pattern for testing a RAM in an LSI circuit and an address and a control signal for reading/writing the test pattern, and a comparator for comparing the test results. By externally performing the minimum setting of the pattern generator, the BIST circuit automatically tests the RAM and holds the comparison result therein. After the test is completed, the BIST circuit outputs the test result to the outside, and the good or bad of the RAM is checked.

Accordingly, the number of test patterns and the test time can be significantly reduced, compared with a method of reading the details held in the RAM to the outside and comparing the results.

FIG. 17 is a circuit diagram of a known RAM and a known BIST circuit.

An LSI circuit 10 includes a RAM 11 and a BIST circuit 12.

The BIST circuit 12 includes a pattern generator 21, a comparator 25, an address holding circuit 26, a bit position holding circuit 27, and an error flag holding circuit 28.

The pattern generator 21 includes a sequencer 22, a data generator 23, and an address generator 24.

The sequencer 22 generates a predetermined pattern sequence that is a set of a combination of multiple test patterns and an address. The sequencer 22 also outputs a control signal based on the pattern sequence to the RAM 11 and the comparator 25.

The data generator 23 outputs data to be written to the RAM 11 at the time of writing a test pattern or outputs data (expected value) expected to be read from the RAM 11 at the time of reading a test pattern.

The address generator 24 generates an address of data to be written to the RAM 11 or generates an address to be read from the RAM 11, and outputs the address to the RAM 11 and the address holding circuit 26.

The comparator 25 compares the data read from the RAM 11 (read data) with the expected value output from the data generator 23. When the read data does not match the expected value, the comparator 25 outputs a signal that instructs the address holding circuit 26 to hold the address to the address holding circuit 26, outputs the bit position of the mismatch to the bit position holding circuit 27, and outputs an error flag that indicates the occurrence of an error to the error flag holding circuit 28.

The address holding circuit 26 stores the address in the RAM 11 where the error has occurred, on the basis of the instruction from the comparator 25.

The bit position holding circuit 27 stores the bit position output from the comparator 25.

The error flag holding circuit 28 stores the flag indicating whether the RAM 11 has an error.

The good or bad check of the RAM 11 is conducted by reading the error flag from the error flag holding circuit 28 after the test.

The error flag indicates the presence of the defective RAM 11 but does not specify the defective portion. Thus, in addition to the error flag, the address information stored in the address holding circuit 26 and the bit position stored in the bit position holding circuit 27 are used as information for specifying the defective portion.

The RAM 11, the comparator 25, the address holding circuit 26, the bit position holding circuit 27, and the error flag holding circuit 28 constitute a RAM-comparison/result holder 30.

When the LSI circuit 10 includes multiple RAMs (e.g., six RAMs), as illustrated in FIG. 18, multiple RAM-comparison/result holders 30-$k$ ($k$=1 to 6) are connected to the single pattern generator 21.

Related art includes Japanese Unexamined Patent Application Publication NOs. 2004-86996 and 2006-38782.

[Patent Document 1] Japanese Laid-Open Patent Publication No. 2004-86996

[Patent Document 2] Japanese Laid-Open Patent Publication No. 2006-38782

SUMMARY

According to an aspect of the invention, a processor includes an arithmetic device, a storage device that holds arithmetic data, a data generator that generates test data, an address generator that generates an address at which the test data is to be written, a test data number counter that counts a number of test data, an error information holder that holds mismatch error information, an error occurrence bit position holder that holds a position of a bit at which a mismatch error has occurred, an error occurrence test data number holder that holds number of test data counted by the test data number counter, and a comparator that compares test data written to the storage device with test data read from the storage device and stores error information in the error information holder and a position of a bit and number of the test data in which the mismatch error has occurred.

The above-described embodiments of the present invention are intended as examples, and all embodiments of the present invention are not limited to including the features described above.

BRIEF DESCRIPTION OF THE DRAWINGS

FIG. 8A is a detailed diagram (upper portion) of RAMs and a BIST circuit according to the second embodiment;

FIG. 10A is a diagram (upper portion) illustrating a modification of the processor according to the second embodiment;

FIG. 19 is a diagram illustrating a pattern sequence used in a RAM test.

DETAILED DESCRIPTION OF THE PREFERRED EMBODIMENTS

Figure 1:
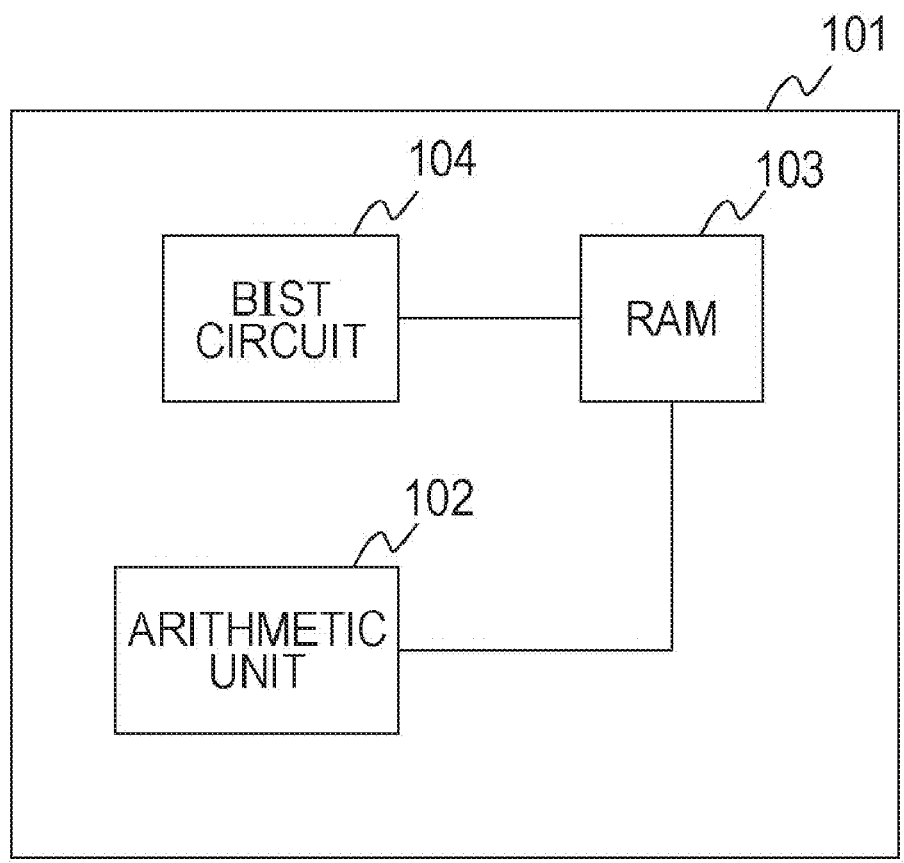
FIG. 1 is a block diagram of a processor according to a first embodiment.

Reference may now be made in detail to embodiments of the present invention, examples of which are illustrated in the accompanying drawings, wherein like reference numerals refer to like elements throughout.

Hereinafter embodiments will be described with reference to the drawings. In the following description, portions given the same reference numerals in the drawings represent the same portions and have similar operations, and descriptions of these portions may be omitted.

FIG. 1 is a block diagram of a processor according to a first embodiment.

A processor 101 includes an arithmetic unit 102, a RAM 103, and a BIST circuit 104.

The processor 101 is an LSI circuit in, for example, a central processing unit (CPU), a digital signal processor (DSP), or a microcontroller.

The arithmetic unit 102 performs arithmetic processing in the processor 101.

The RAM 103 stores data used in the arithmetic unit 102.

The BIST circuit 104 is a built-in self-test circuit that tests the RAM 103.

Figure 2:
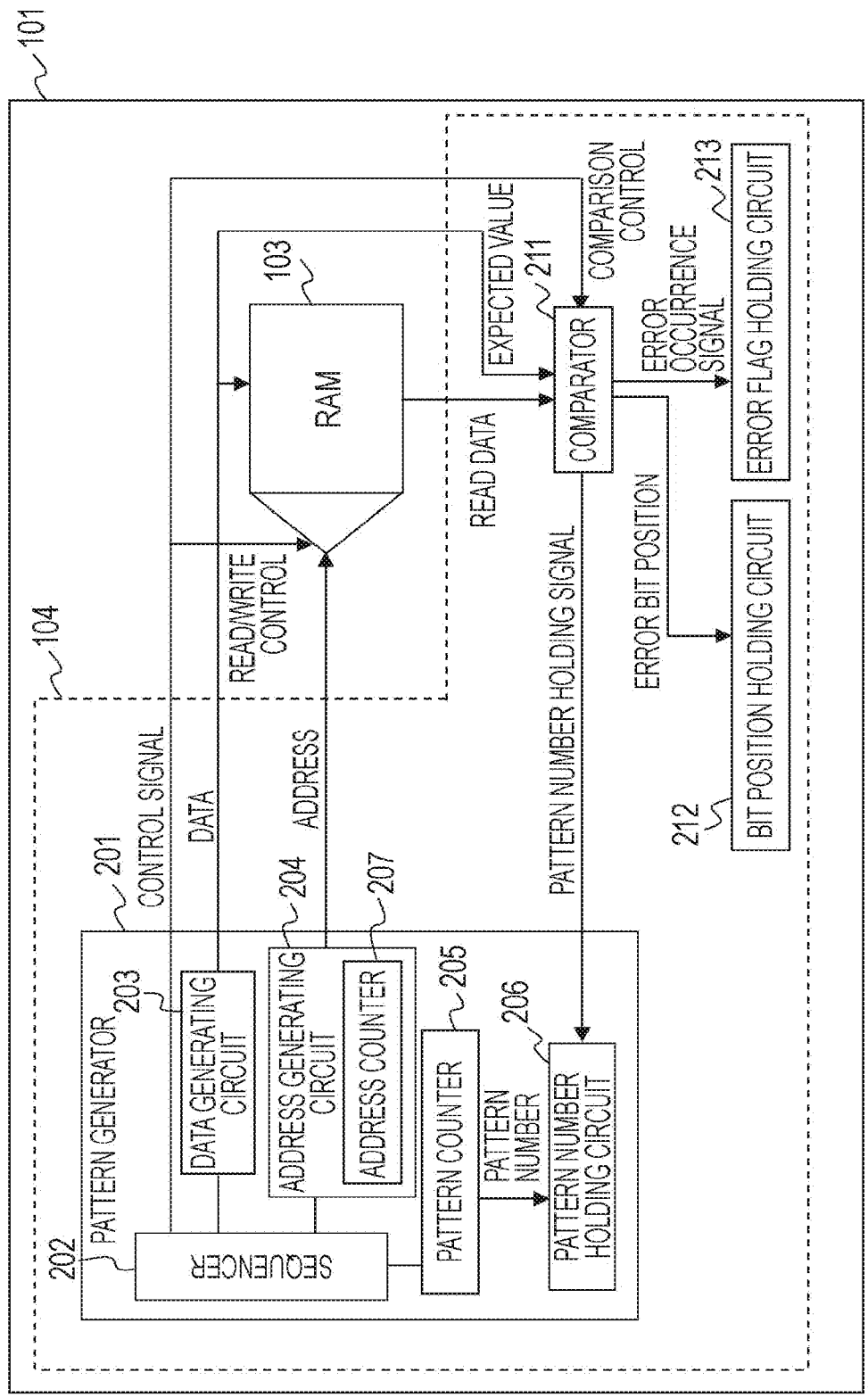
FIG. 2 is a detailed diagram of a RAM and a BIST circuit according to the first embodiment.

FIG. 2 is a detailed diagram of a RAM and a BIST circuit according to the first embodiment.

The arithmetic unit 102 is not illustrated in FIG. 2.

The RAM 103 reads/writes specified data at a specified address on the basis of a reading/writing control signal. In the present embodiment, for example, the RAM 103 has 1024 addresses and stores 72-bit data at each address.

The BIST circuit 104 includes a pattern generator 201, a comparator 211, a bit position holding circuit 212, and an error flag holding circuit 213.

The pattern generator 201 includes a sequencer 202, a data generating circuit 203, an address generating circuit 204, a pattern counter 205, and a pattern number holding circuit 206.

Figure 3:
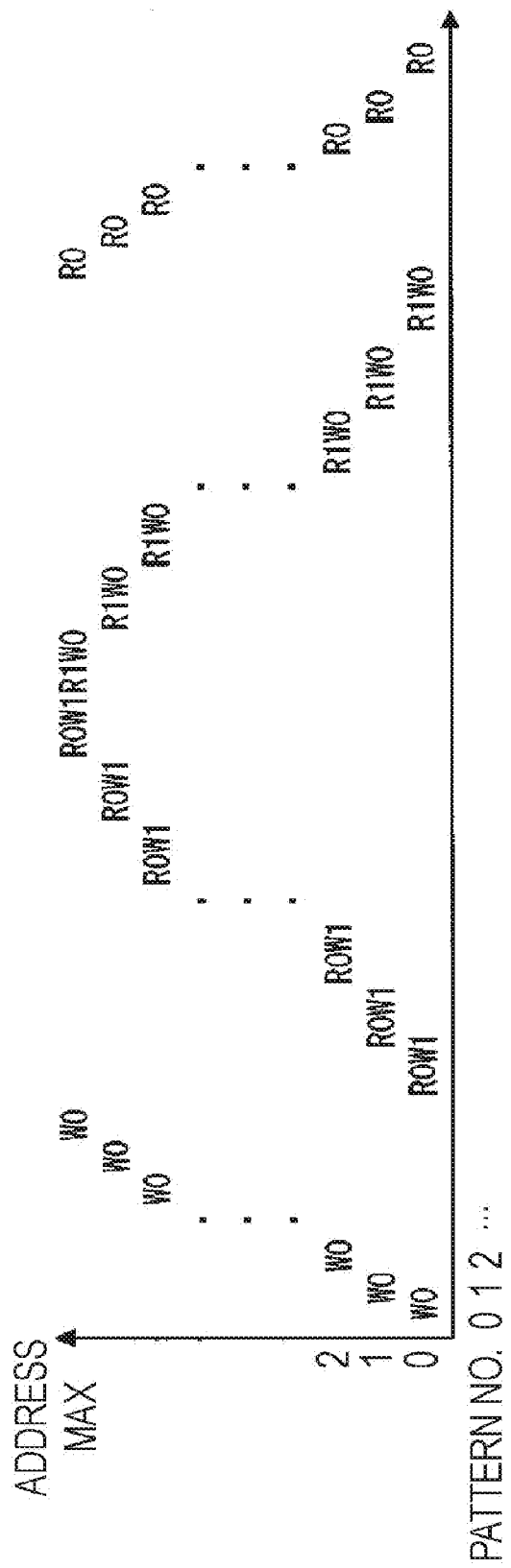
FIG. 3 is a diagram illustrating a pattern sequence and a pattern number according to the first embodiment.

In the first embodiment, the pattern generator 201 generates a pattern sequence, as illustrated in FIG. 3. In FIG. 3, the memory address is plotted in ordinate and the time is plotted in abscissa. "W0" denotes writing 0 to the memory, and "W1" denotes writing 1 to the memory. "R0" denotes reading data and checking whether the data is 0, and "R1" denotes reading data and checking whether the data is 1.

What type of pattern sequence is to be used in a RAM test is set in advance or instructed from the outside of the LSI. Therefore, the user can be informed of what type of pattern sequence is used. Referring again to FIG. 2, the pattern generator 201 generates a predetermined pattern sequence on the basis of the setting or the instruction.

The sequencer 202 generates a preset pattern sequence. The sequencer 202 also outputs a control signal based on the pattern sequence to the RAM 103 and the comparator 211.

The data generating circuit 203 outputs data to be written to the RAM 103 at the time of writing a test pattern or data (expected value) expected to be read from the RAM 103 at the time of reading a test pattern. The expected value is data previously written at the address in the RAM 103 that is read at the time of reading the pattern.

The address generating circuit 204 includes an address counter 207.

The address counter 207 generates an address of data to be written to the RAM 103 or an address of data to be read from the RAM 103, and outputs the address to the RAM 103.

The pattern counter 205 increments the pattern number every time a pattern is generated, and outputs the current pattern number to the pattern number holding circuit 206. As illustrated in FIG. 3, one pattern number corresponds to one test pattern. For example, in FIG. 3, pattern number 0 corresponds to the first test pattern of a pattern sequence of writing data 0 to address 0.

Figure 4A:
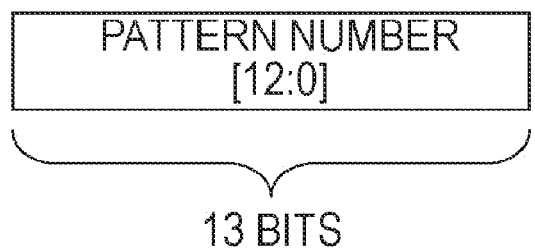
FIG. 4A is a diagram illustrating the format of a pattern number.

Referring again to FIG. 2, the pattern number holding circuit 206 stores the pattern number output from the pattern counter 205, upon receipt of a pattern number holding signal output from the comparator 211. In the present embodiment, when the pattern sequence illustrated in FIG. 3 is executed, six accesses are established to one address. Therefore, the total number of test patterns is 1024×6=6144, and the number of bits necessary for holding a pattern number is 13. Thus, in the present embodiment, the format of a pattern number is a 13-bit format, as illustrated in FIG. 4A.

The comparator 211 compares the data read from the RAM 103 (read data) with the expected value output from the data generating circuit 203. When the read data does not match the expected value, the comparator 211 outputs a signal that instructs the pattern number holding circuit 206 to hold the pattern number (pattern number holding signal) to the pattern number holding circuit 206, outputs the bit position of the mismatch to the bit position holding circuit 212, and outputs an error flag that indicates the occurrence of an error to the error flag holding circuit 213.

Figure 4B:
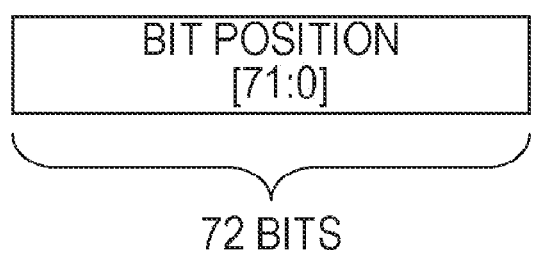
FIG. 4B is a diagram illustrating the format of a bit position.

The bit position holding circuit 212 stores the bit position output from the comparator 211. In the present embodiment, the number of bits of the RAM 103 is 72 bits. Thus, the format of a bit position is a 72-bit format, as illustrated in FIG. 4B.

Figure 4C:
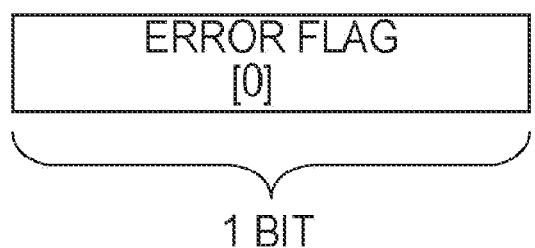
FIG. 4C is a diagram illustrating the format of an error flag.

The error flag holding circuit 213 stores the flag indicating whether the RAM 103 has an error, which is output from the comparator 211. In the present embodiment, the format of an error flag is a 1-bit format, as illustrated in FIG. 4C.

Figure 5:
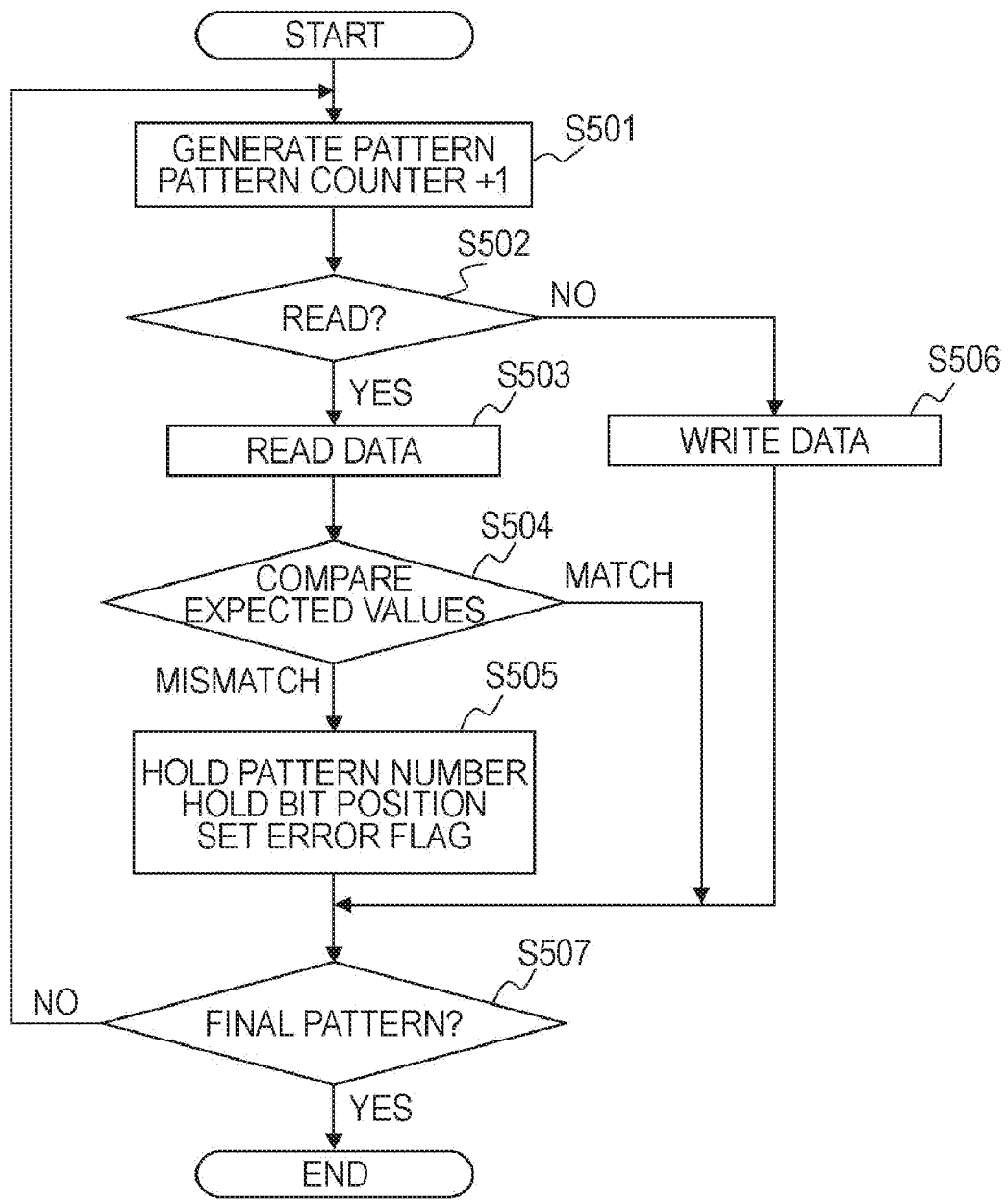
FIG. 5 is a flowchart of a process performed by the BIST circuit according to the first embodiment.

FIG. 5 is a flowchart of a process performed by the BIST circuit according to the first embodiment.

In operation S501, the sequencer 202 causes the data generating circuit 203 to generate a predetermined test pattern. On the basis of the instruction from the sequencer 202, the data generating circuit 203 outputs the test pattern to the RAM 103 and the comparator 211. The address counter 207 outputs an address to be read or written to the RAM 103. The pattern counter 205 increments the pattern number and outputs the current pattern number to the pattern number holding circuit 206.

In operation S502, the RAM 103 determines whether the RAM 103 is instructed to perform reading on the basis of the control signal from the sequencer 202. When the RAM 103 is instructed to perform reading, the flow proceeds to operation S503. When the RAM 103 is instructed to perform writing, the flow proceeds to operation S506.

In operation S503, the RAM 103 reads data at the address specified by the address generating circuit 204, and outputs the data to the comparator 211.

In operation S504, the comparator 211 compares the data read from the RAM 103 (read data) with the expected value output from the data generating circuit 203. When the read data matches the expected value, the flow proceeds to operation S507. When the read data does not match the expected value, the flow proceeds to operation S505.

In operation S505, the comparator 211 outputs a pattern number holding signal that gives an instruction to hold the current pattern number, namely, the pattern number in which the error has occurred, to the pattern number holding circuit 206. The pattern number holding circuit 206 stores the pattern number. The comparator 211 also outputs the bit position at which the error has occurred to the bit position holding circuit 212. The bit position holding circuit 212 stores the received bit position. The comparator 211 further outputs an error occurrence signal indicating that the error has occurred to the error flag holding circuit 213. The error flag holding circuit 213 stores an error flag indicating that the error has occurred.

In operation S506, the RAM 103 writes the data received from the data generating circuit 203 at the address received from the address generating circuit 204.

In operation S507, the sequencer 202 determines whether the pattern is the final pattern. When the pattern is the final pattern, the process is terminated. When the pattern is not the final pattern, the flow returns to operation S501.

According to the processor of the first embodiment, a pattern number in which an error has occurred can be detected. By applying the pattern number to a pattern sequence used in a RAM test, the position in the pattern sequence at which the error has occurred can be detected. Accordingly, more detailed failure analysis can be conducted.

Figure 6:
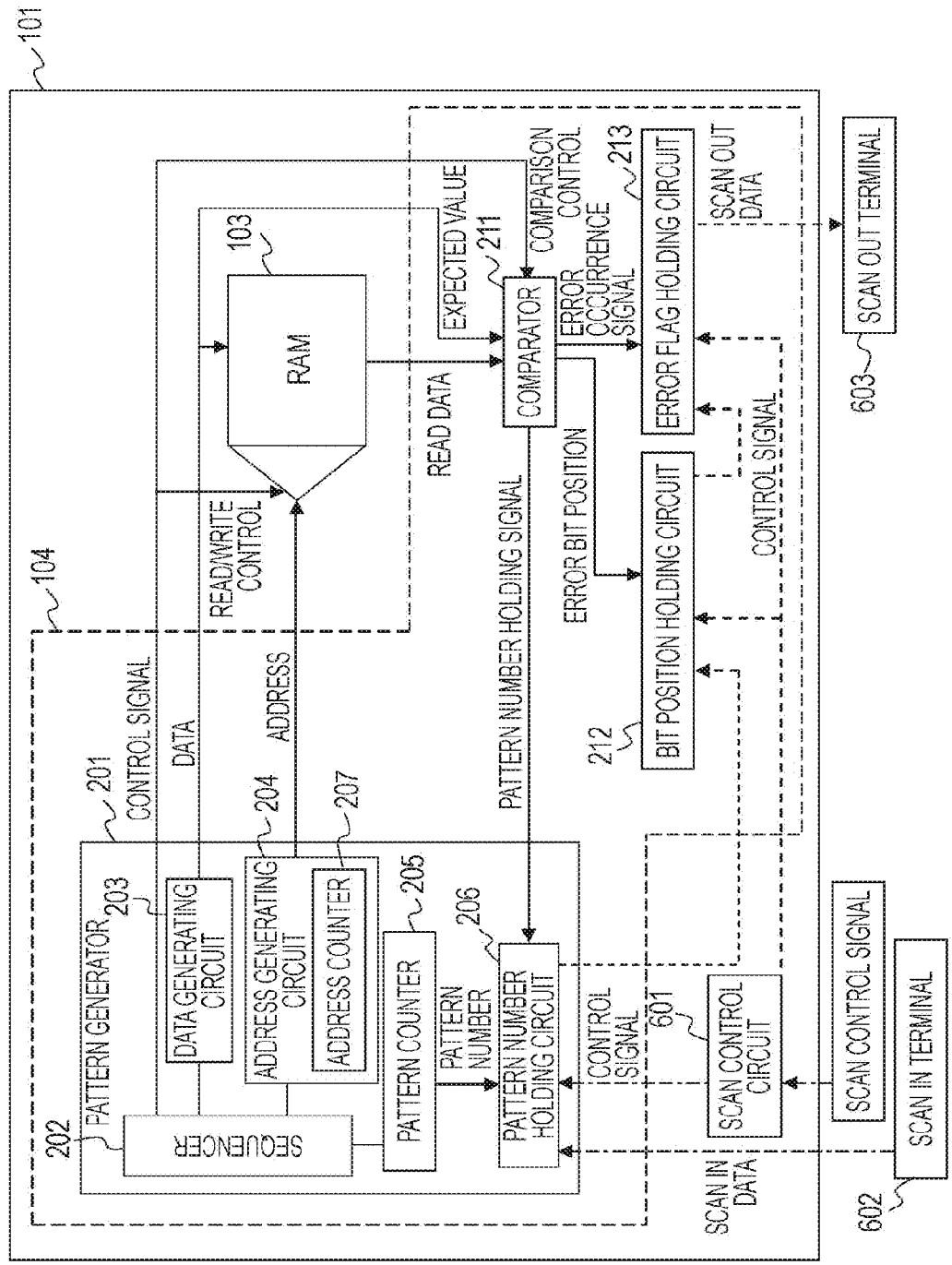
FIG. 6 is a diagram illustrating a modification of the processor according to the first embodiment.

FIG. 6 is a diagram illustrating a modification of the processor according to the first embodiment.

The arithmetic unit 102 is not illustrated in FIG. 6.

In the modification of the processor according to the first embodiment, the processor 101 further includes a scan control circuit 601, a scan in terminal 602, and a scan out terminal 603.

The scan in terminal 602 is connected to the pattern number holding circuit 206, and scan in data is input to the pattern number holding circuit 206.

The scan out terminal 603 is connected to the error flag holding circuit 213, and scan out data is output from the error flag holding circuit 213 to the scan out terminal 603.

The pattern number holding circuit 206 is connected to the bit position holding circuit 212, and scan data from the pattern number holding circuit 206 is input to the bit position holding circuit 212. The bit position holding circuit 212 is connected to the error flag holding circuit 213, and scan data from the bit position holding circuit 212 is input to the error flag holding circuit 213. Accordingly, a scan chain is realized by connecting the scan in terminal 602, the pattern number holding circuit 206, the bit position holding circuit 212, the error flag holding circuit 213, and the scan out terminal 603 in this order. Also, the scan control circuit 601 is connected to the pattern number holding circuit 206, the bit position holding circuit 212, and the error flag holding circuit 213.

A scan control signal is input to the scan control circuit 601. The scan control circuit 601 outputs a control signal that controls a scan operation to the pattern number holding circuit 206, the bit position holding circuit 212, and the error flag holding circuit 213.

Under control of the scan control circuit 601, data stored in the pattern number holding circuit 206, the bit position holding circuit 212, and the error flag holding circuit 213 is read to the outside as scan out data via the scan chain.

Next, the case where multiple RAMs are mounted will be described.

Figure 7:
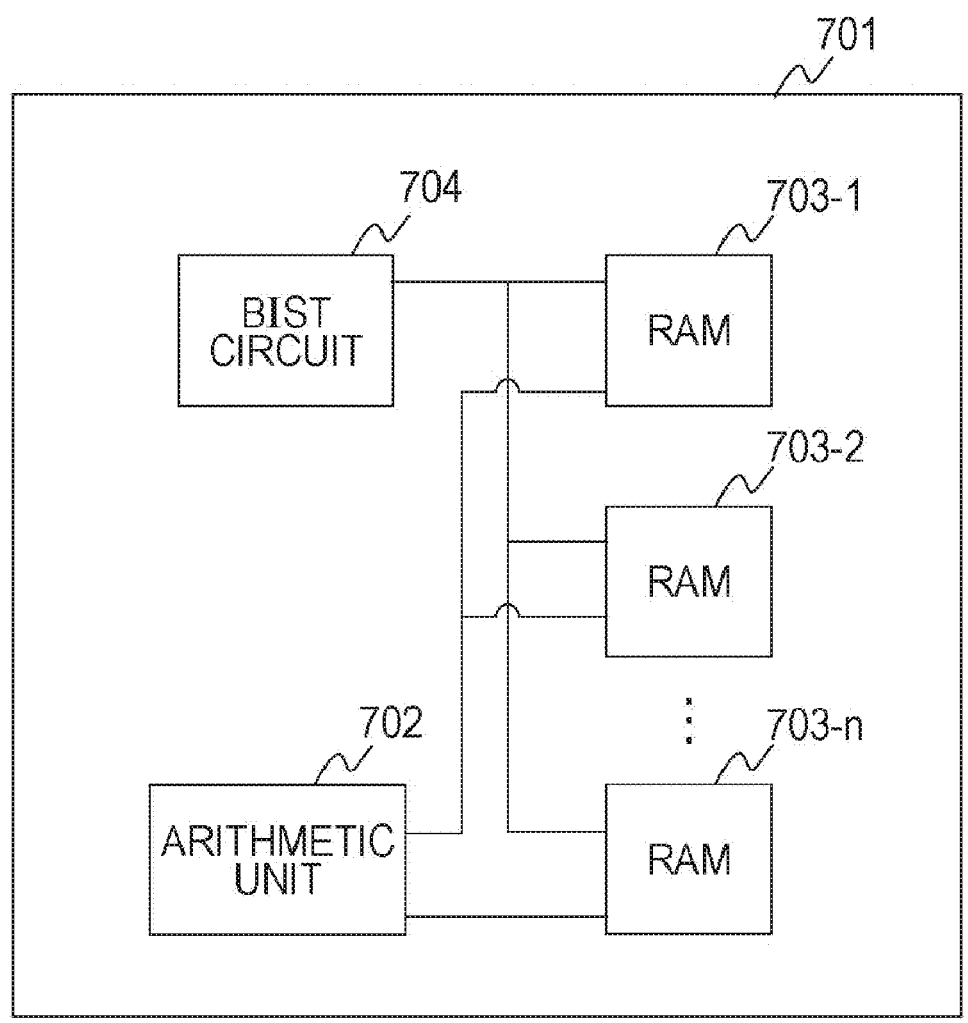
FIG. 7 is a block diagram of a processor according to a second embodiment.

FIG. 7 is a block diagram of a processor according to a second embodiment.

A processor 701 includes an arithmetic unit 702, RAMs 703-$i$ ($i$=1 to n), and a BIST circuit 704.

The processor 701 is an LSI circuit in, for example, a CPU, a DSP, or a microcontroller.

The arithmetic unit 702 performs arithmetic processing in the processor 701.

The RAMs 703-$i$ store data used in the arithmetic unit 702.

The BIST circuit 704 is a built-in self-test circuit that tests the RAMs 703-$i$.

The processor 701 according to the second embodiment includes the multiple RAMs 703-$i$.

Figure 8B:
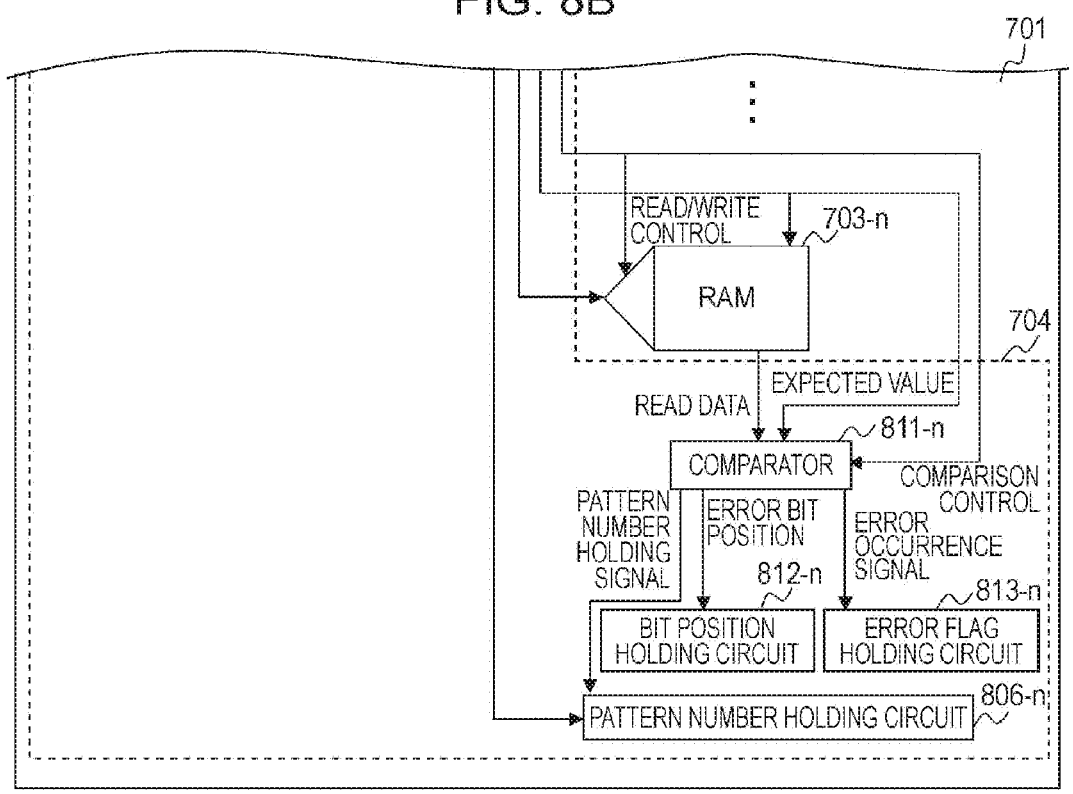
FIG. 8B is a detailed diagram (lower portion) of the RAMs and the BIST circuit according to the second embodiment.

FIGS. 8A and 8B are diagrams illustrating the detailed upper and lower portions of RAMs and a BIST circuit according to the second embodiment.

The arithmetic unit 702 is not illustrated in FIGS. 8A and 8B.

The RAMs 703-$i$ are the same as the RAM 103 in the first embodiment.

The BIST circuit 704 includes a pattern generator 801, comparators 811-$i$ ($i$=1 to n), bit position holding circuits 812-$i$ ($i$=1 to n), error flag holding circuits 813-$i$ ($i$=1 to n), and pattern number holding circuits 806-$i$ ($i$=1 to n).

The pattern generator 801 includes a sequencer 802, a data generating circuit 803, an address generating circuit 804, and a pattern counter 805.

The address generating circuit 804 includes an address counter 807.

The sequencer 802, the data generating circuit 803, the address generating circuit 804, the pattern counter 805, and the address counter 807 are the same as the sequencer 202, the data generating circuit 203, the address generating circuit 204, the pattern counter 205, and the address counter 207 in the first embodiment.

The comparators 811-$i$, the bit position holding circuits 812-$i$, the error flag holding circuits 813-$i$, and the pattern number holding circuits 806-$i$ are the same as the comparator 211, the bit position holding circuit 212, the error flag holding circuit 213, and the pattern number holding circuit 206 in the first embodiment.

When compared with the first embodiment, the second embodiment is different in that the pattern number holding circuits 806-$i$ (i=1 to n) are not included in the pattern generator 801, and the number of the pattern number holding circuits 806-$i$ is the same as the number of the RAMs 703-$i$ to be tested.

Figure 9:
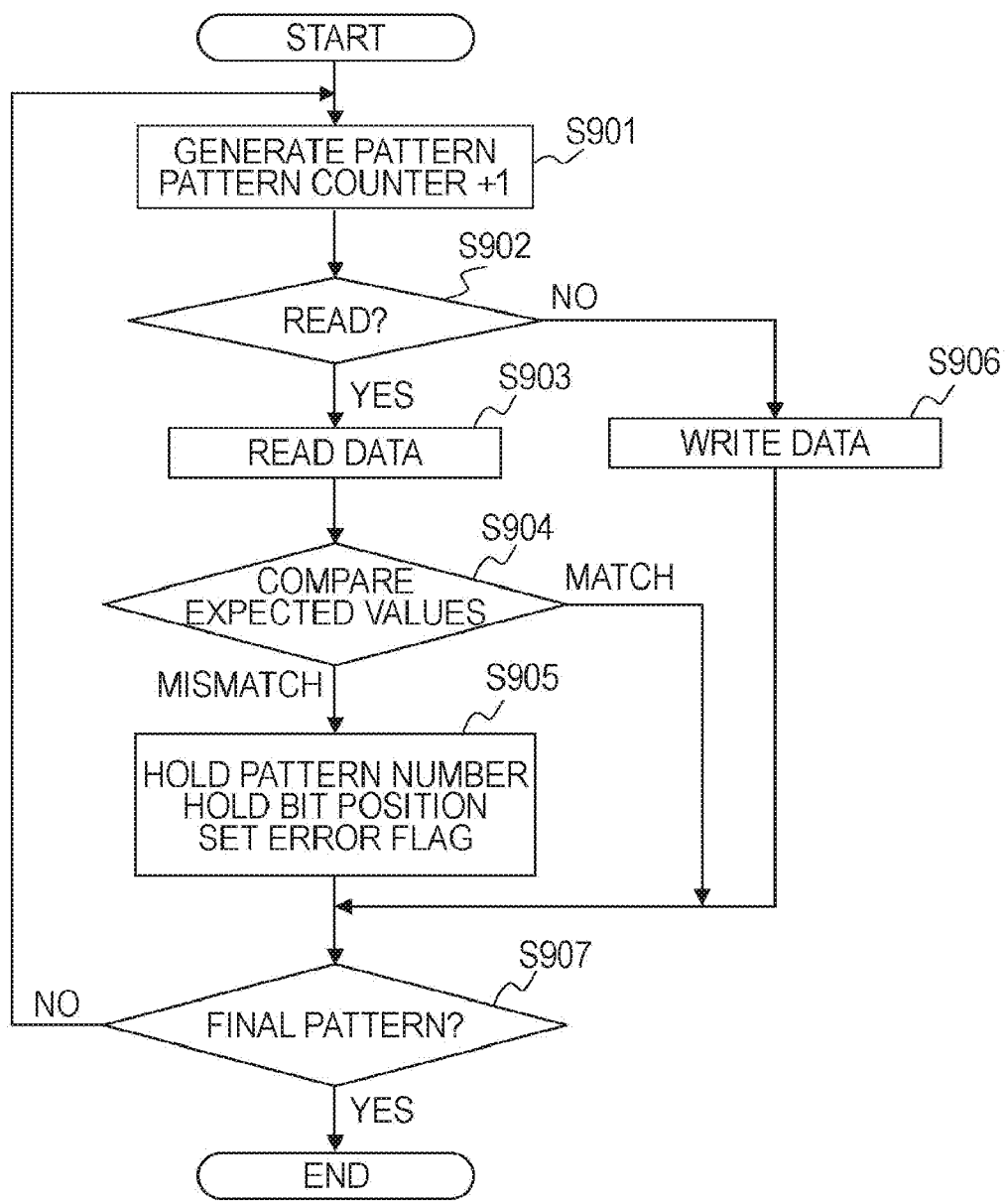
FIG. 9 is a flowchart of a process performed by the BIST circuit according to the second embodiment.

FIG. 9 is a flowchart of a process performed by the BIST circuit according to the second embodiment.

In operation S501, the sequencer 802 causes the data generating circuit 803 to generate a predetermined test pattern. On the basis of the instruction from the sequencer 802, the data generating circuit 803 outputs the test pattern to each of the RAMs 703-$i$ and each of the comparators 811-$i$. The address counter 807 outputs an address to be read or written to the RAM 703-$i$. The pattern counter 805 outputs the pattern number to each of the pattern number holding circuits 806-$i$.

In operation S902, the RAM 703-$i$ determines whether the RAM 703-$i$ is instructed to perform reading on the basis of the control signal from the sequencer 802. When the RAM 703-$i$ is instructed to perform reading, the flow proceeds to operation S903. When the RAM 703-$i$ is instructed to perform writing, the flow proceeds to operation S906.

In operation S903, the RAM 703-$i$ reads data at the address specified by the address generating circuit 804, and outputs the data to the comparator 811-$i$.

In operation S904, the comparator 811-$i$ compares the data read from the RAM 703-$i$ (read data) with the expected value output from the data generating circuit 803. When the read data matches the expected value, the flow proceeds to operation S907. When the read data does not match the expected value, the flow proceeds to operation S905.

In operation S905, the comparator 811-$i$ outputs a pattern number holding signal that gives an instruction to hold the current pattern number, namely, the pattern number in which the error has occurred, to the pattern number holding circuit 806-$i$. The pattern number holding circuit 806-$i$ stores the pattern number. The comparator 811-$i$ also outputs the bit position at which the error has occurred to a corresponding one of the bit position holding circuits 812-$i$. The bit position holding circuit 812-$i$ stores the received bit position. The comparator 811-$i$ further outputs an error occurrence signal indicating that the error has occurred to a corresponding one of the error flag holding circuits 813-$i$. The error flag holding circuit 813-$i$ stores an error flag indicating that the error has occurred.

In operation S906, the RAM 703-$i$ writes the data received from the data generating circuit 803 at the address received from the address generating circuit 804.

In operation S907, the sequencer 802 determines whether the pattern is the final pattern. When the pattern is the final pattern, the process is terminated. When the pattern is not the final pattern, the flow returns to operation S901.

According to the processor of the second embodiment, a pattern number in which an error has occurred can be detected. By applying the pattern number to a pattern sequence used in a RAM test, the position in the pattern sequence at which the error has occurred can be detected. Accordingly, more detailed failure analysis can be conducted.

Also, even when multiple RAMs are mounted, only a single pattern generator is required. Therefore, the cost can be reduced.

Figure 10B:
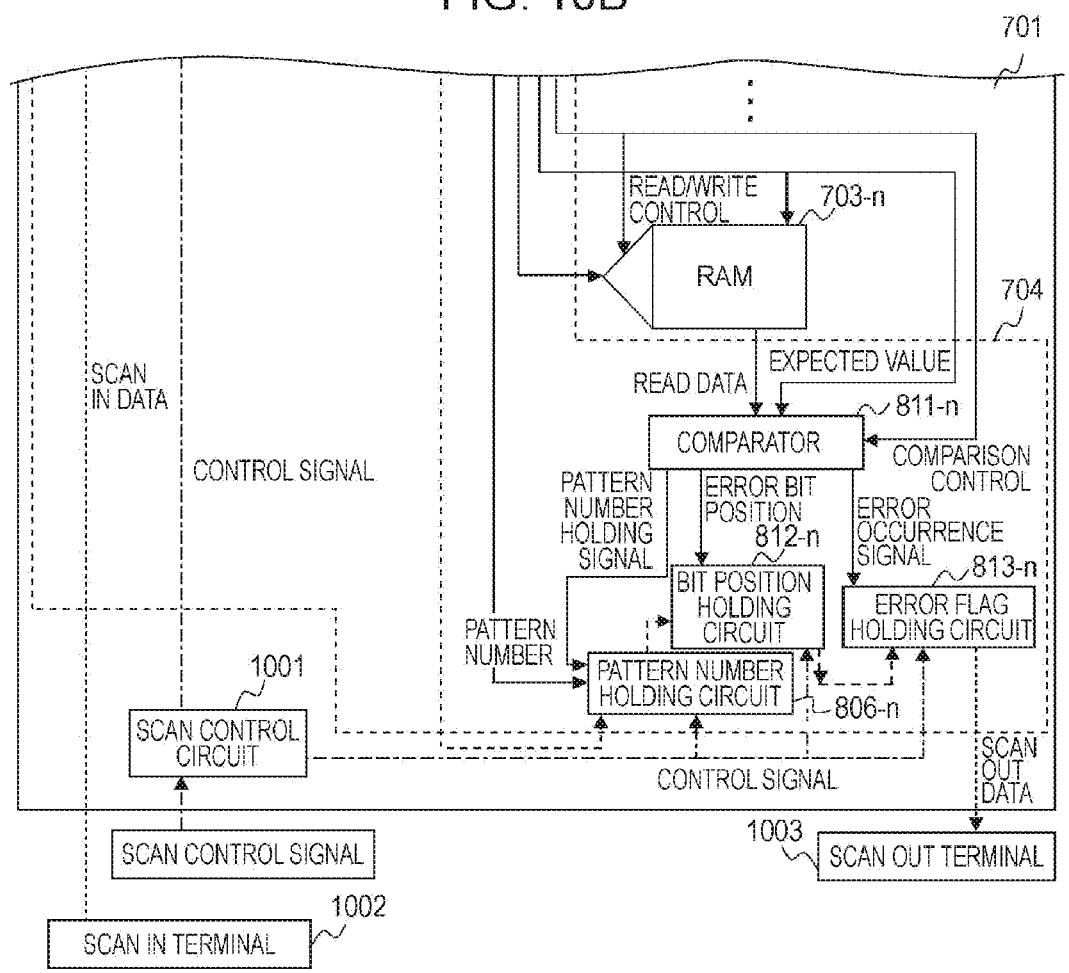
FIG. 10B is a diagram (lower portion) illustrating the modification of the processor according to the second embodiment.

FIGS. 10A and 10B are diagrams illustrating the upper and lower portions of a modification of the processor according to the second embodiment.

The arithmetic unit 702 is not illustrated in FIGS. 10A and 10B.

In the modification of the processor according to the second embodiment, the processor 701 further includes a scan control circuit 1001, a scan in terminal 1002, and a scan out terminal 1003.

The scan in terminal 1002 is connected to the pattern number holding circuit 806-1, and scan in data is input to the pattern number holding circuit 806-1.

The scan out terminal 1003 is connected to the error flag holding circuit 813-$n$, and scan out data is output from the error flag holding circuit 813-$n$ to the scan out terminal 1003.

The pattern number holding circuit 806-1 is connected to the bit position holding circuit 812-1. The bit position holding circuit 812-1 is connected to the error flag holding circuit 813-1. The error flag holding circuit 813-1 is connected to the pattern number holding circuit 806-2, . . . . The error flag holding circuit 813-($n$-1) (not illustrated) is connected to the pattern number holding circuit 806-$n$. The pattern number holding circuit 806-$n$ is connected to the bit position holding circuit 812-$n$. The bit position holding circuit 812-$n$ is connected to the error flag holding circuit 813-$n$.

Accordingly, a scan chain is realized by connecting the scan in terminal 1002, the pattern number holding circuit 806-1, the bit position holding circuit 812-1, the error flag holding circuit 813-1, the pattern number holding circuit 806-2, . . . , the error flag holding circuit 813-($n$-1), the pattern number holding circuit 806-$n$, the bit position holding circuit 812-$n$, the error flag holding circuit 813-$n$, and the scan out terminal 1003 in this order. Also, the scan control circuit 1001 is connected to the pattern number holding circuits 806-$i$ (i=1 to n), the bit position holding circuits 812-$i$, and the error flag holding circuits 813-$i$.

A scan control signal is input to the scan control circuit 1001. The scan control circuit 1001 outputs a control signal that controls a scan operation to the pattern number holding circuits 806-$i$, the bit position holding circuits 812-$i$, and the error flag holding circuits 813-$i$.

Under control of the scan control circuit 1001, data stored in the pattern number holding circuits 806-$i$, the bit position holding circuits 812-$i$, and the error flag holding circuit 813-$i$ is read to the outside as scan out data via the scan chain.

Figure 11:
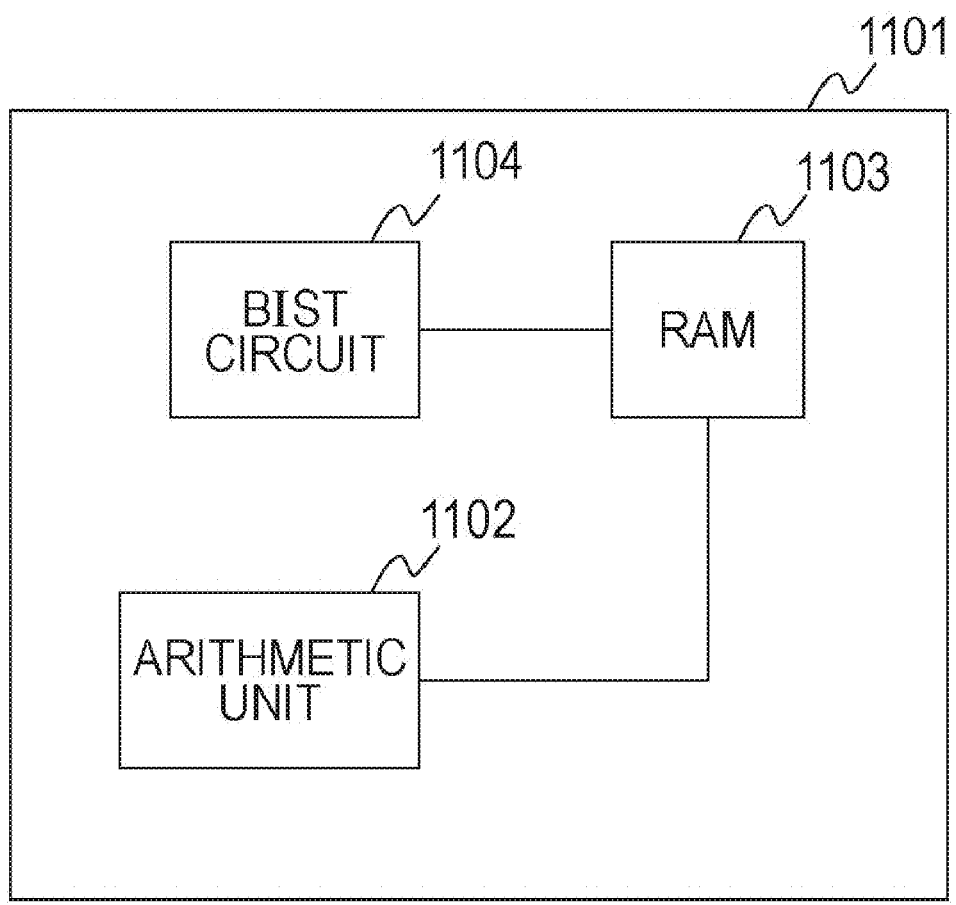
FIG. 11 is a block diagram of a processor according to a third embodiment.

FIG. 11 is a block diagram of a processor according to a third embodiment.

A processor 1101 includes an arithmetic unit 1102, a RAM 1103, and a BIST circuit 1104.

The processor 1101 is an LSI circuit in, for example, a CPU, a DSP, or a microcontroller.

The arithmetic unit 1102 performs arithmetic processing in the processor 1101.

The RAM 1103 stores data used in the arithmetic unit 1102.

The BIST circuit 1104 is a built-in self-test circuit that tests the RAM 1103.

Figure 12:
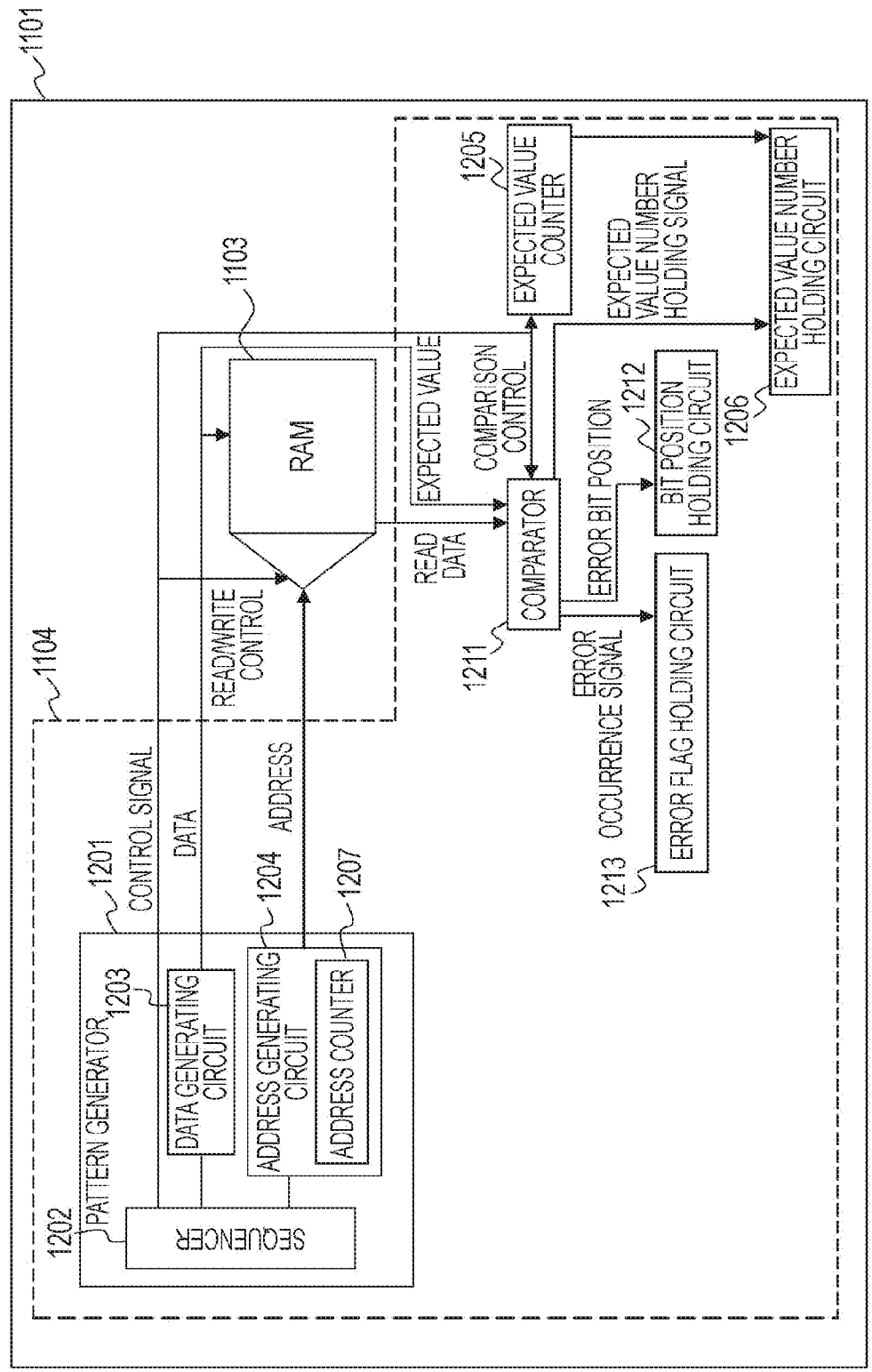
FIG. 12 is a detailed diagram of a RAM and a BIST circuit according to the third embodiment.

FIG. 12 is a detailed diagram of a RAM and a BIST circuit according to the third embodiment.

The arithmetic unit 1102 is not illustrated in FIG. 12.

The RAM 1103 is the same as the RAM 103 in the first embodiment.

The BIST circuit 1104 includes a pattern generator 1201, a comparator 1211, a bit position holding circuit 1212, an error flag holding circuit 1213, an expected value counter 1205, and an expected value number holding circuit 1206.

The pattern generator 1201 includes a sequencer 1202, a data generating circuit 1203, and an address generating circuit 1204.

The address generating circuit 1204 includes an address counter 1207.

The sequencer 1202, the data generating circuit 1203, the address generating circuit 1204, and the address counter 1207 are the same as the sequencer 202, the data generating circuit 203, the address generating circuit 204, and the address counter 207 in the first embodiment.

Figure 13:
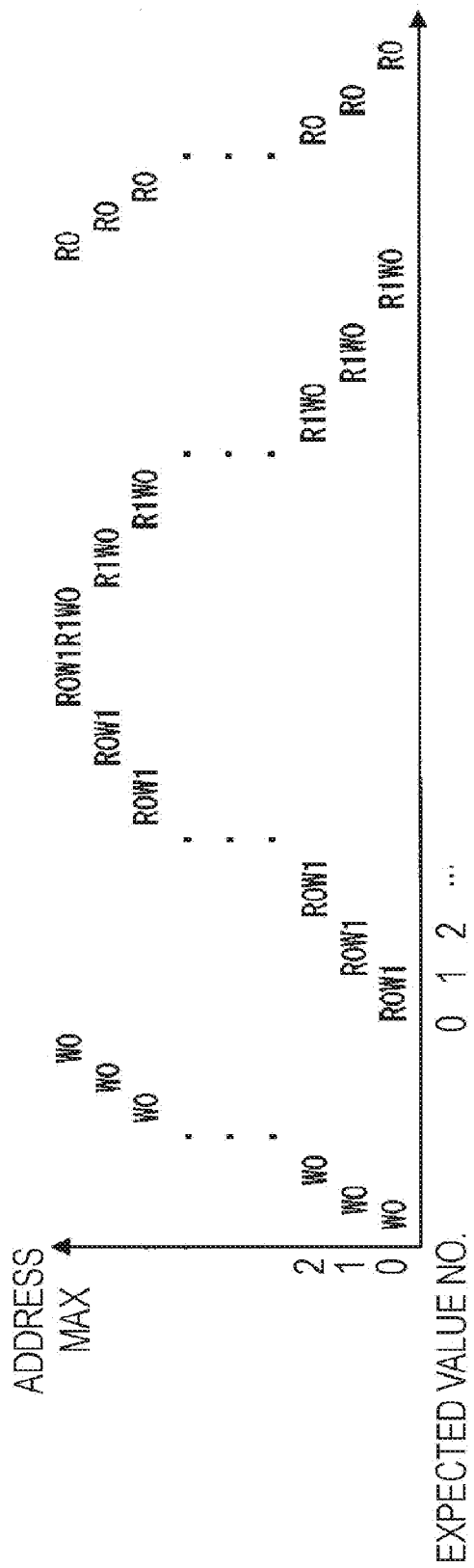
FIG. 13 is a diagram illustrating a pattern sequence and an expected value number according to the third embodiment.

In the third embodiment, the pattern generator 1201 generates a pattern sequence that is a set of a combination of multiple test patterns, as illustrated in FIG. 13. In FIG. 13, the memory address is plotted in ordinate and the time is plotted in abscissa. W0 denotes writing 0 to the memory, and W1 denotes writing 1 to the memory. R0 denotes reading data and checking whether the data is 0, and R1 denotes reading data and checking whether the data is 1.

The bit position holding circuit 1212 and the error flag holding circuit 1213 are the same as the bit position holding circuit 212 and the error flag holding circuit 213 in the first embodiment.

The comparator 1211 compares the data read from the RAM 1103 (read data) with the expected value output from the data generating circuit 1203. When the read data does not match the expected value, the comparator 1211 outputs a signal that instructs the expected value number holding circuit 1206 to hold the expected value number (expected value number holding signal) to the expected value number holding circuit 1206, outputs the bit position of the mismatch to the bit position holding circuit 1212, and outputs an error flag that indicates the occurrence of an error to the error flag holding circuit 1213.

The expected value counter 1205 increments the expected value number every time an instruction to compare the read data with the expected value is given to the comparator 1211, and outputs the expected value number to the expected value number holding circuit 1206. As illustrated in FIG. 13, one reading corresponds to one expected value number. For example, as illustrated in FIG. 13, expected value number 0 corresponds to the first test pattern of reading data in which the expected value is 0 from address 0.

Figure 14:
FIG. 14 is a diagram illustrating the format of an expected value number.

The expected value number holding circuit 1206 stores the expected value number output from the expected value counter 1205, upon receipt of an expected value number holding signal output from the comparator 1211. In the present embodiment, when the pattern sequence illustrated in FIG. 13 is executed, three accesses are established to one address. Therefore, the total number of test patterns is 1024× 3=3072, and the number of bits necessary for holding an expected value number is 12. Thus, in the present embodiment, the format of an expected value number is a 12-bit format, as illustrated in FIG. 14.

Figure 15:
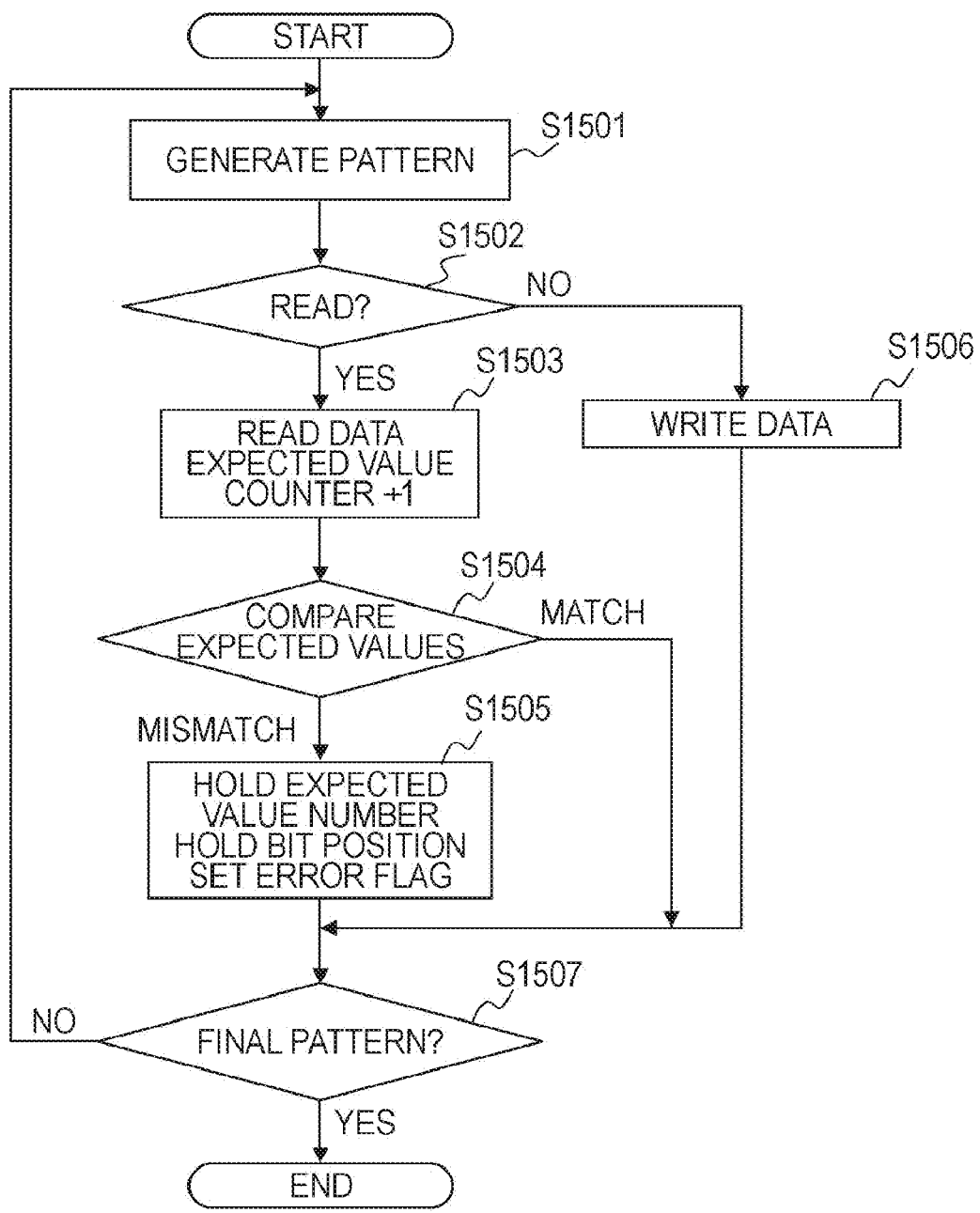
FIG. 15 is a flowchart of a process performed by the BIST circuit according to the third embodiment.

FIG. 15 is a flowchart of a process performed by the BIST circuit according to the third embodiment.

In operation S1501, the sequencer 1202 causes the data generating circuit 1203 to generate a predetermined test pattern. On the basis of the instruction from the sequencer 1202, the data generating circuit 1203 outputs the test pattern to the RAM 1103 and the comparator 1211. The address counter 1207 outputs an address to be read or written to the RAM 1103.

In operation S1502, the RAM 1103 determines whether the RAM 1103 is instructed to perform reading on the basis of the control signal from the sequencer 1202. When the RAM 1103 is instructed to perform reading, the flow proceeds to operation S1503. When the RAM 1103 is instructed to perform writing, the flow proceeds to operation S1506.

In operation S1503, the RAM 1103 reads data at the address specified by the address generating circuit 1204, and outputs the data to the comparator 211. The expected value counter 1205 increments the expected value number and outputs the current expected value number to the expected value number holding circuit 1206.

In operation S1504, the comparator 1211 compares the data read from the RAM 1103 (read data) with the pattern (expected value) output from the data generating circuit 1203. When the read data matches the expected value, the flow proceeds to operation S1507. When the read data does not match the expected value, the flow proceeds to operation S1505.

In operation S1505, the comparator 1211 outputs an expected value number holding signal that gives an instruction to hold the current expected value number, namely, the expected value number in which the error has occurred, to the expected value number holding circuit 1206. The expected value number holding circuit 1206 stores the expected value number. The comparator 1211 also outputs the bit position at which the error has occurred to the bit position holding circuit 1212. The bit position holding circuit 1212 stores the received bit position. The comparator 1211 further outputs an error occurrence signal indicating that the error has occurred to the error flag holding circuit 1213. The error flag holding circuit 1213 stores an error flag indicating that the error has occurred.

In operation S1506, the RAM 1103 writes the data received from the data generating circuit 1203 at the address received from the address generating circuit 1204.

In operation S1507, the sequencer 1202 determines whether the pattern is the final pattern. When the pattern is the final pattern, the process is terminated. When the pattern is not the final pattern, the flow returns to operation S1501.

According to the processor of the third embodiment, an expected value number in which an error has occurred can be detected. By applying the expected value number to a pattern sequence used in a RAM test, the position in the pattern sequence at which the error has occurred can be detected. Accordingly, more detailed failure analysis can be conducted.

Since the expected value number has a fewer number of bits than the pattern number used in the first embodiment, the number of bits of data used can be reduced in the third embodiment.

Unlike the first and second embodiments, the pattern generator 1201 requires no pattern counter. Thus, a pattern generator that is the same as a known pattern generator can be used in the third embodiment.

Figure 16:
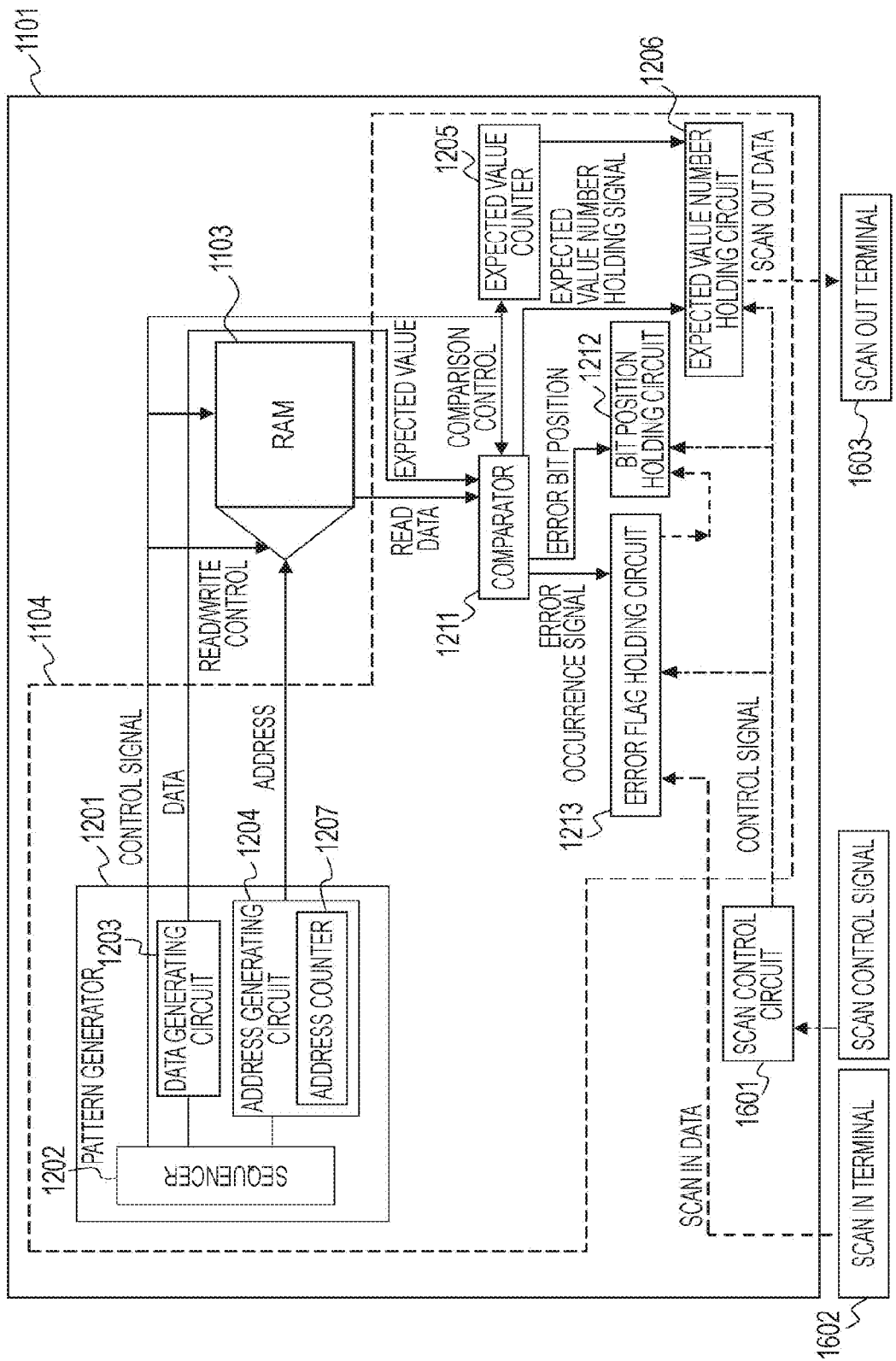
FIG. 16 is a diagram illustrating a modification of the processor according to the third embodiment.
Figure 17:
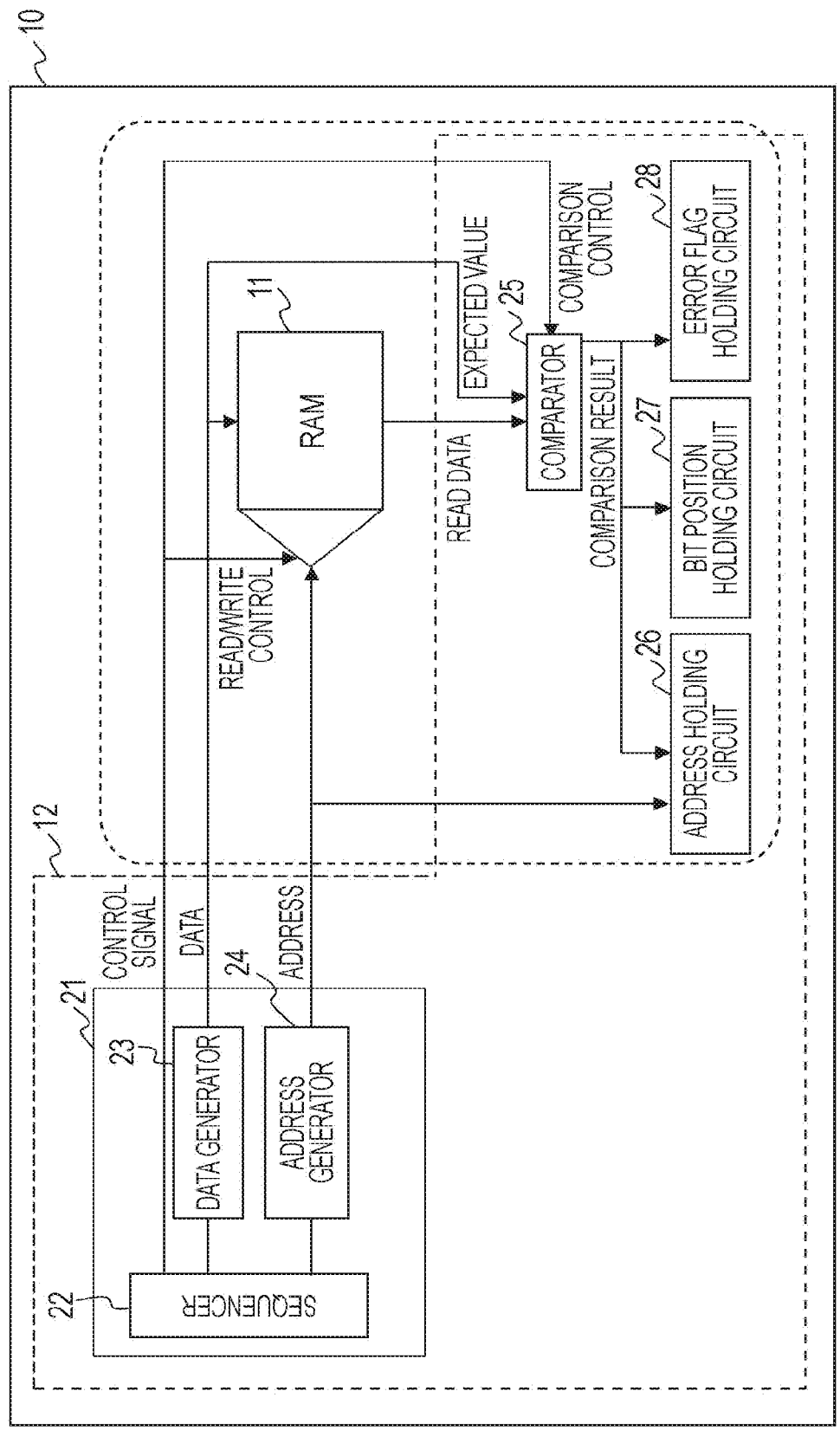
FIG. 17 is a block diagram of a known RAM and a known BIST circuit.
Figure 18:
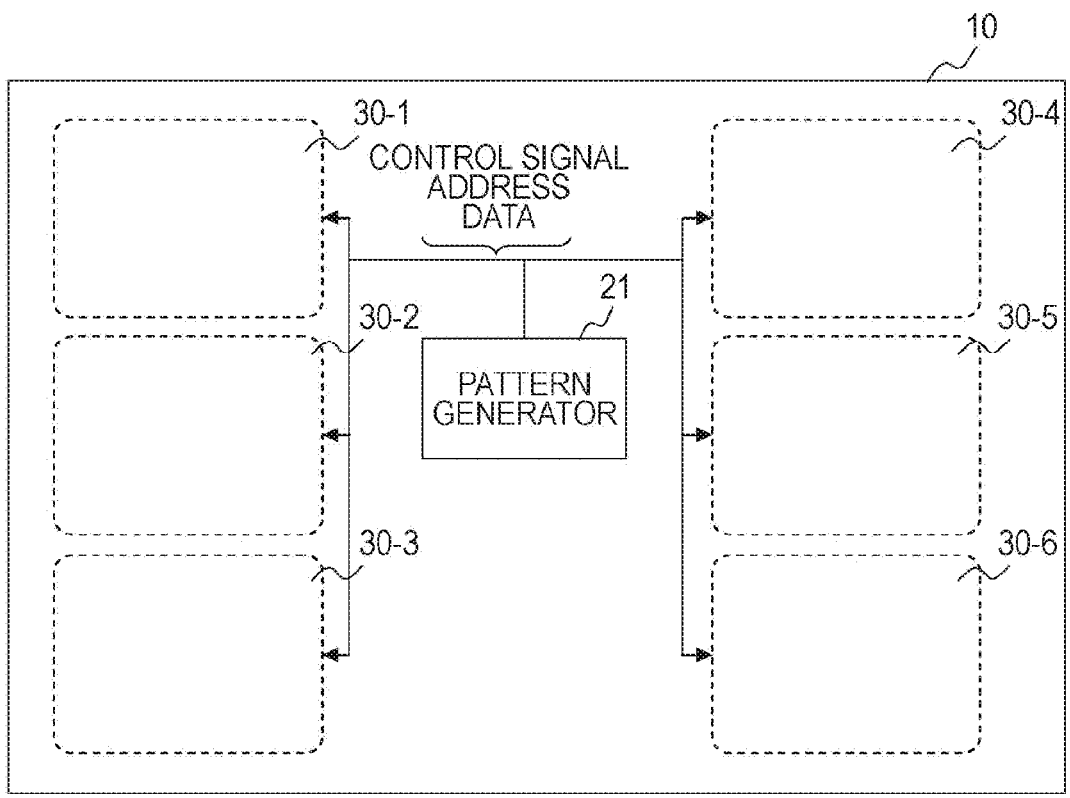
FIG. 18 is a block diagram of an LSI circuit including multiple RAMs.

FIG. 16 is a diagram illustrating a modification of the processor according to the third embodiment.

The arithmetic unit 1102 is not illustrated in FIG. 16.

In the modification of the processor according to the third embodiment, the processor 1101 further includes a scan control circuit 1601, a scan in terminal 1602, and a scan out terminal 1603.

The scan in terminal 1602 is connected to the error flag holding circuit 1213, and scan in data is input to the error flag holding circuit 1213.

The scan out terminal 1603 is connected to the expected value number holding circuit 1206, and scan out data is output from the expected value number holding circuit 1206 via the scan out terminal 1603 to the outside.

The error flag holding circuit 1213 is connected to the bit position holding circuit 1212, and scan data from the error flag holding circuit 1213 is input to the bit position holding circuit 1212. The bit position holding circuit 1212 is connected to the expected value number holding circuit 1206, and scan data from the bit position holding circuit 1212 is input to the expected value number holding circuit 1206.

Accordingly, a scan chain is realized by connecting the scan in terminal 1602, the error flag holding circuit 1213, the bit position holding circuit 1212, the expected value number holding circuit 1206, and the scan out terminal 1603 in this order. Also, the scan control circuit 1601 is connected to the error flag holding circuit 1213, the bit position holding circuit 1212, and the expected value number holding circuit 1206.

A scan control signal is input to the scan control circuit 1601. The scan control circuit 601 outputs a control signal that controls a scan operation to the error flag holding circuit 1213, the bit position holding circuit 1212, and the expected value number holding circuit 1206.

Under control of the scan control circuit 1601, data stored in the error flag holding circuit 1213, the bit position holding circuit 1212, and the expected value number holding circuit 1206 is read to the outside as scan out data via the scan chain.

Although a few preferred embodiments of the present invention have been shown and described, it would be appreciated by those skilled in the art that changes may be made in these embodiments without departing from the principles and spirit of the invention, the scope of which is defined in the claims and their equivalents.

What is claimed is:

1. A processor comprising:
an arithmetic device;
a storage device that holds arithmetic data to be supplied to the arithmetic device;
a data generator that generates a test pattern to be written to the storage device;
an address generator that generates an address of the storage device at which the test pattern is to be written;
a test pattern number counter that counts a number of the test pattern every time the data generator generates the test pattern;
an error information holder that holds mismatch error information;
an error occurrence bit position holder that holds position information of a bit in the test pattern at which a mismatch error has occurred;
an error occurrence test pattern number information holder that holds the number of test pattern counted by the test pattern number counter in accordance with test pattern in which a mismatch error has occurred; and
a comparator that compares the test pattern written to the storage device with test data read from the storage device, stores error information in the error information holder when a mismatch error has occurred as a result of the comparison, stores position information of a bit at which the mismatch error has occurred in the error occurrence bit position holder, and that stores the number of the test pattern in which the mismatch error has occurred in the error occurrence test pattern number information holder.

2. The processor according to claim 1, further comprising:
a scan chain that connects the error information holder, the error occurrence bit position holder, and the error occurrence test pattern number information holder; and
a scan chain control device that controls the scan chain,
wherein, the error information held in the error information holder, the position information of the bit at which the mismatch error has occurred which is held in the error occurrence bit position holder, and the number of the test pattern in which the mismatch error has occurred which is held in the error occurrence test pattern number information holder, are read via the scan chain by the scan chain control device.

3. A processor comprising:
an arithmetic device;
a first storage device that hold arithmetic data to be supplied to the arithmetic device;
a second storage device that hold arithmetic data to be supplied to the arithmetic device;
a data generator that generates a test pattern to be written to the first and second storage devices;
an address generator that generates an address of the storage device at which the test pattern is to be written;
a test pattern number counter that counts a number of the test pattern every time the data generator generates the test pattern;
a first error information holder that holds first mismatch error information of a first mismatch error in the first storage device;
a second error information holder that holds second mismatch error information of a second mismatch error in the second storage device;
a first error occurrence bit position holder that holds position information of a bit in the test pattern at which the first mismatch error in the first storage device has occurred;
a second error occurrence bit position holder that holds position information of a bit in the test pattern at which the second mismatch error in the second storage device has occurred;
a first error occurrence test pattern number information holder that holds the number of the test pattern counted by the test pattern number counter in accordance with the test pattern in which the first mismatch error in the first storage device has occurred;
a second error occurrence test pattern number information holder that holds the number of the test pattern counted by the test pattern number counter in accordance with the test pattern in which the second mismatch error in the second storage device has occurred;
a first comparator that compares the test pattern written to the first storage device with test data read from the storage device, stores error information in the first error information holder when a first mismatch error in the first storage device has occurred as a result of the first comparison, stores position information of a bit at which the first mismatch error has occurred in the first error occurrence bit position holder, and stores the number of the test pattern in which the first mismatch error has occurred in the first error occurrence test pattern number information holder; and
a second comparator that compares the test pattern written to the second storage device with test data read from the storage device, stores error information in the second error information holder when a second mismatch error in the second storage device has occurred as a result of the second comparison, stores position information of a bit at which the second mismatch error has occurred in the second error occurrence bit position holder, and stores the number of the test pattern in which the second mismatch error has occurred in the second error occurrence test pattern number information holder.

4. The processor according to claim 3, further comprising:
a scan chain that connects the first and second error information holders, the first and second error occurrence bit position holders, and the first and second error occurrence test pattern number information holders; and
a scan chain control device that controls the scan chain,
wherein, the first error information held in the first error information holder, the second error information held in the second error information holder, the position information of the bit at which the first mismatch error has occurred, which is held in the first error occurrence bit position holder, the position information of the bit at which the second mismatch error has occurred, which is held in the second error occurrence bit position holder, the number of the test pattern in which the first mismatch error has occurred, which is held in the first error occurrence test data number information holder, and the number of the test pattern in which the second mismatch error has occurred, which is held in the second error occurrence test pattern number information holder, are read via the scan chain by the scan chain control device.

5. A processor comprising:
an arithmetic device;
a storage device that holds arithmetic data to be supplied to the arithmetic device;
a data generator that generates a test pattern to be written to the storage device;
an address generator that generates an address of the storage device at which the test pattern is to be written;
an error information holder that holds mismatch error information;
an error occurrence bit position holder that holds position information of a bit at which a mismatch error has occurred in the test pattern;
an expected value data number counter that counts a number of expected value data regarding the test pattern written to the storage device by performing counting every time the test pattern written to the storage device is compared with test data read from the storage device;
an error occurrence expected value data number information holder that holds the number of expected value data counted by the expected value data number counter in accordance with the test pattern in which a mismatch error has occurred; and
a comparator that compares the test pattern written to the storage device with test data read from the storage device, stores error information in the error information holder when a mismatch error has occurred as a result of the comparison, stores position information of a bit at which the mismatch error has occurred in the error occurrence bit position holder, and stores the number of expected value data in which the mismatch error has occurred in the error occurrence expected value data number information holder.

6. The processor according to claim 5, further comprising:
a scan chain that connects the error information holder, the error occurrence bit position holder, and the error occurrence expected value data number information holder; and
a scan chain control device that controls the scan chain,
wherein, the error information held in the error information holder, the position information of the bit at which the mismatch error has occurred, which is held in the error occurrence bit position holder, and the number of the expected value data in which the mismatch error has occurred, which is held in the error occurrence expected value data number information holder, are read via the scan chain by the scan chain control devices.

7. A control method for a storage-device test device that tests a storage device that holds arithmetic data to be supplied to an arithmetic device, comprising:
generating a test pattern to be written to the storage device;
generating an address of the storage device at which the test pattern is to be written;
counting a number of the test pattern every time the test pattern is generated;
comparing the test pattern written to the storage device with test data read from the storage device; and
holding error information, position information of a bit in the test pattern at which the mismatch error has occurred, and the number of the test pattern in which the mismatch error has occurred in the comparing.

8. A control method for a storage-device test device that tests a storage device that holds arithmetic data to be supplied to an arithmetic device, comprising:
generating a test pattern;
generating an address of the storage device at which the test pattern is to be written;
comparing the test pattern written to the storage device with test data read from the storage device;
counting a number of expected value data regarding the test pattern written to the storage device by performing counting every time the test pattern written to the storage device is compared with test data read from the storage device; and
holding error information, position information of a bit in the test pattern at which the mismatch error has occurred, and number of expected value data in which the mismatch error has occurred in the comparing.

* * * * *

UNITED STATES PATENT AND TRADEMARK OFFICE
CERTIFICATE OF CORRECTION

PATENT NO. : 8,365,027 B2  
APPLICATION NO. : 12/628470  
DATED : January 29, 2013  
INVENTOR(S) : Yanagida Page 1 of 1

It is certified that error appears in the above-identified patent and that said Letters Patent is hereby corrected as shown below:

In the Claims:

Column 12, Line 64, In Claim 4, delete "data" and insert -- pattern --, therefor.
Column 13, Line 9, In Claim 4, delete "data" and insert -- pattern --, therefor.

Signed and Sealed this
Seventh Day of May, 2013

Teresa Stanek Rea
*Acting Director of the United States Patent and Trademark Office*